United States Patent [19]
Brinker et al.

[11] Patent Number: 4,652,467
[45] Date of Patent: Mar. 24, 1987

[54] INORGANIC-POLYMER-DERIVED DIELECTRIC FILMS

[75] Inventors: C. Jeffrey Brinker; Keith D. Keefer, both of Albuquerque, N. Mex.; Patrick M. Lenahan, State College, Pa.

[73] Assignee: The United States of America as represented by the United States Department of Energy, Washington, D.C.

[21] Appl. No.: 704,697

[22] Filed: Feb. 25, 1985

[51] Int. Cl.$^4$ .......................... B05D 5/06; B05D 5/12; B05D 7/24
[52] U.S. Cl. ........................................ 427/246; 427/93; 427/162; 427/165; 427/168; 427/169; 427/243; 427/247
[58] Field of Search .................. 427/93, 246, 162, 168, 427/243, 165, 169, 247

[56] References Cited

U.S. PATENT DOCUMENTS 3,301,706  1/1967  Flaschen et al. .................. 427/93 X
3,772,066  11/1973  Clark et al. ............................ 427/387
4,277,525  7/1981  Nakayama et al. ........... 427/393.6 X

OTHER PUBLICATIONS

*Whittington's Dictionary of Plastics*, 2nd edition, Westport, CT, Technomic Publishing Co., Inc., 1978, p. 259.
Brinker et al., "Sol-Gel Transition in Simple Silicates," J. Non-Cryst., Solids, 48 (1982), pp. 47-64.
Brinker et al., "Sol-Gel Transition in Simple Silicates II," J. Non-Cryst. Solids, 63 (1984), pp. 45-59.
Schaefer et al., "Characterization of Polymers and Gels by Intermediate Angle X-Ray Scattering," presented at the International Union of Pure and Applied Chemists MACRO '82, Amherst, MA, Jul. 12, 1982.
Pettit et al., "Sol-Gel Protective Coatings for Black Chrome Solar Selective Films," SPIE, vol. 324, Optical Coating for Energy Efficient and Solar Applications (pub. by the Society of Photo-Optical Instrumentation Engineers, Bellingham, WA) (1982), pp. 176-183.
Brinker et al., "Relationships Between the Sol to Gel and the Gel to Glass Conversions," Proceedings of the International Conference on Ultrastructure Processing of Ceramics, Glasses, and Composites (John Wiley & Sons, N.Y.) (1984).
Brinker et al., "Conversion of Monolithic Gels to Glasses in a Multicomponent Silicate Glass System," J. Materials Sci., 16 (1981), pp. 1980-1988.
Brinker et al., "A Comparison Between the Densification Kinetics of Colloidal and Polymeric Silica Gels," Mat. Res. Soc. Symp. Proc., 32 (1984), pp. 25—32.
Brinker et al., "Sol-Gel Derived Antireflective Coatings for Silicon," Solar Energy Matls, 5 (1981), pp. 159-172.
Brinker et al., "Comparison of Sol-Gel Derived Thin Films with Monoliths in Multicomponent Silicate Glass Systems," Thin Solid Films, 77 (1981), pp. 141-148.
Brinker et al., "Sol-Gel Derived Antireflective Coatings," Proc. of the Distributed Solar Collector Conference, Albuquerque, NM, Mar. 1983, pp. 68-80.

*Primary Examiner*—Evan K. Lawrence
*Attorney, Agent, or Firm*—Armand McMillan; Albert Sopp; Judson R. Hightower

[57] ABSTRACT

A method of coating a substrate with a thin film of a polymer of predetermined porosity comprises depositing the thin film on the substrate from a non-gelled solution comprising at least one hydrolyzable metal alkoxide of a polymeric network forming cation, water, an alcohol compatible with the hydrolysis and the polymerization of the metal alkoxide, and an acid or a base, prior to depositing the film, controlling the structure of the polymer for a given composition of the solution exclusive of the acid or base component and the water component, (a) by adjusting each of the water content, the pH, and the temperature to obtain the desired concentration of alkoxide, and then adjusting the time of standing of the solution prior to lowering the temperature of the solution, and (b) lowering the temperature of the solution after the time of standing to about 15 degrees C. or lower to trap the solution in a state in which, after the depositing step, a coating of the desired porosity will be obtained, and curing the deposited film at a temperature effective for curing whereby there is obtained a thin film of a polymer of a predetermined porosity and corresponding pore size on the substrate.

15 Claims, No Drawings

INORGANIC-POLYMER-DERIVED DIELECTRIC FILMS

The U.S. Government has rights in this invention pursuant to Contract No. DE-AC04-76DP00789 between the U.S. Department of Energy and AT&T Technologies, Inc.

BACKGROUND OF THE INVENTION

This invention relates to a method for producing thin films on a variety of substrates.

There is currently a need for a wide variety of thin film types on an equally wide variety of substrates. For example, often it is desired to protect a substrate with a durable glass-like film resistant to environmental effects. In other situations, it is desired to apply a thin film imparting certain operational characteristics to the substrate, e.g., an antireflection coating or a planarization layer in a semiconductor device, e.g., a MOS device. This variety of films requires a concomitant variety of film types, especially with regard to the porosity of the film. In addition, depending upon the application, the film must have an appropriate conductivity, dielectric strength, adherability, compatibility, etc. Of course, it is also important that the film be applicable to a wide variety of substrates, e.g., metals, glasses, ceramics, polymers, etc., by preferably simple commercial techniques such as spraying, dipping, spinning, etc. It is also desirable in any thin film coating method that the option exist for curing the thin film on the substrate at a relatively low temperature, for instance where the substrate is temperature sensitive.

The most common methods of applying thin films to metal, glass, ceramic and other substrates are chemical vapor deposition (CVD), plasma enhanced chemical vapor deposition (PECVD), sputtering, and thermal oxidation. All have disadvantages, especially with regard to the low temperature preparation of dielectric films as desribed below.

CVD, PECVD, and sputtering are relatively expensive techniques (due to both equipment costs and inherently low deposition rates) which are amenable primarily to small substrates. More importantly, from a technical standpoint, CVD requires that the substrate be heated to quite high temperatures (e.g., 600°–800° C.) during deposition to allow diffusion and reaction of the deposited species. This has several limitations: (1) it precludes the use of non-refractory substrates such as Al; (2) it normally results in polycrystalline films in which grain boundaries serve as sinks for impurities and thus provide high diffusivity paths for ionic conductivity; and (3) the deposited film is often not fully dense despite the high deposition temperature. Additionally, CVD is restricted to particular ambients for particular films, e.g., silicon nitride is always deposited under highly reducing conditions. Therefore, it is not always possible to optimize the deposition ambient for a particular substrate or process.

PECVD reduces the required deposition temperature to, e.g., 300°–400° C. The deposited film, however, is typically porous and for oxide films, e.g., $SiO_2$, careful process control must be maintained in order to avoid particle formation.

Sputtered dielectric films are difficult to prepare because the sputtered species travel at different relative velocities during deposition. Thus, films tend to become enriched in heavy elements and depleted in light elements compared to the target composition. It is, therefore, difficult to control, e.g., oxygen stoichiometry in $SiO_2$ films.

CVD, PECVD and sputtering all produce highly conformal coatings, i.e., they tend to replicate surface morphology rather than planarize it. This is a disadvantage, e.g., in many advanced MOS designs and, therefore, B, P, $SiO_2$ films are being developed. These films flow at 800° to 1000° C. to provide planarization. However, this method is obviously not a low temperature process, and there remains a need for a lower temperature method to produce planarized dielectric films.

Thermal oxidation is routinely used to prepare dielectric films. This technique has the advantage that high density and high dielectric strengths (e.g., 6–7 MV $cm^{-1}$ for $SiO_2$) can be obtained, but the inherent limitations of this technique are that high temperatures (e.g., 950° C. for $SiO_2$) are required and the choice of substrates is limited primarily to Si.

A less common method of preparing an amorphous film is based on the sol-gel process. In this process, metal alkoxides of network forming cations, e.g., Si, Al, B, Ti, P, and optionally soluble salts of modifying cations, are used as glass precursors. In alcoholic solutions catalyzed by additions of acid or base, the alkoxides are partially or completely hydrolyzed and then polymerized to form molecules of glass-like oxide networks linked by bridging oxygen atoms. This technique is readily adapted to preparation of multicomponent oxide solutions as well as single component systems.

The net reactions which describe this process are generally represented as:

$$M(OR)_n + xH_2O \rightarrow M(OH)_x(OR)_{n-x} + x\ ROH \qquad (1)$$

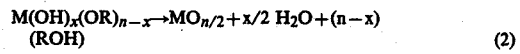
$$M(OH)_x(OR)_{n-x} \rightarrow MO_{n/2} + x/2\ H_2O + (n-x)(ROH) \qquad (2)$$

where x in reaction 1 can be varied, e.g., from about 1–20. Generally, reaction 2 does not go to completion, i.e., colloidal particles of anhydrous oxides do not result. When the growing polymers link together to form an infinite network, the solution stiffens to a gel.

The chemistry involved in the formation of these monolithic gels is well documented in the prior art. See, e.g., (1) Brinker et al, "Sol-gel Transition in Simple Silicates", J. Non-Cryst. Solids, 48 (1982) 47–64; (2) Brinker et al, "Sol-gel Transition in Simple Silicates II", J. Non-Cryst. Solids, 63 (1984) 45–59; (3) Schaefer et al, "Characterization of Polymers and Gels by Intermediate Angle X-ray Scattering", presented at the International Union of Pure and Applied Chemists MACRO'82, Amherst, MA, July 12, 1982; (4) Pettit et al, Sol-Gel Protective Coatings for Black Chrome Solar Selective Films, SPIE Vol. 324, Optical Coatings for Energy Efficiency and Solar Applications, (pub. by the Society of Photo-Optical Instrumentation Engineers, Bellingham, WA) (1982) 176–183; (5) Brinker et al, "Relationships Between the Sol to Gel and Gel to Glass Conversions", Proceedings of the International Conference on Ultrastructure Processing of Ceramics, Glasses, and Composites, (John Wiley and Sons, N.Y.) (1984); (6) Brinker et al, "Conversion of Monolithic Gels to Glasses in a Multicomponent Silicate Glass System", J. Materials Sci., 16 (1981) 1980–1988; (7) Brinker et al, "A Comparison Between the Densification Kinetics of Colloidal and Polymeric Silica Gels", Mat. Res. Soc. Symp. Proc. Vol. 32 (1984), 25–32; all of which disclosures are entirely incorporated by reference herein. For example, much work has been done in characterizing the relationship between the properties of a monolithic, bulk gel prepared by these systems and of the properties of the solution from which such a gel is made. For instance, the relationship between solution characteristics such as pH and water content for a given solution chemical composition and the size and nature of the polymer which results in solution, and the relationship between such polymer properties and the characteristics of the finally produced gel, e.g., the degree of crosslinking, the porosity of the gel, etc., have been well studied and discussed in these references; see, e.g., references (1) and (2) above.

However, the same degree of knowledge has not heretofore been established or disclosed for thin films prepared from the mentioned sol-gel solutions. The fact that gel formation can be retarded by making the solutions sufficiently dilute, e.g., less than 10% equivalent oxides, is known. In such dilutions, more typically 2-5% equivalent oxides, the solution can be applied to various substrates by conventional processes. Such thin film preparations have been reported in Brinker et al, "Sol-Gel Derived Antireflective Coatings for Silicon", 5 (1981) 159-172, which disclosure is entirely incorporated by reference herein. Under such circumstances, the partially hydrolyzed glass-like polymers react chemically with the substrate surface, thereby achieving complete wetting. This can be represented as shown below, wherein a silica-like polymer reacts with the hydroxylated monolayer of a metal, M, to produce direct M-O-Si bonds resulting in excellent adherence.

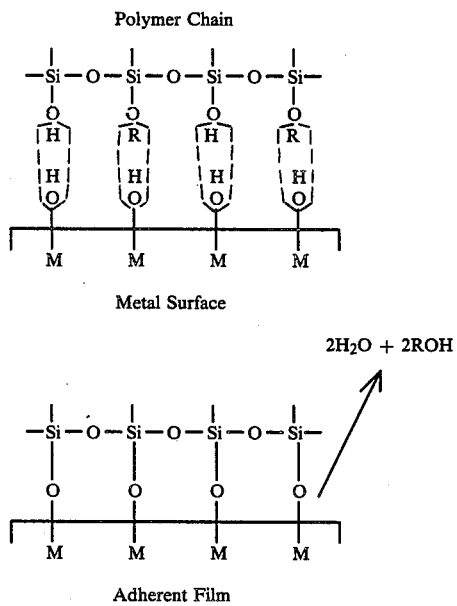

The thin film is glass-like and has a certain microporosity which results during evaporation of solvent following film application. In the past, a comparison has been reported between monoliths, i.e., the bulk gels discussed above, and thin films derived from sol-gel solutions of similar oxide composition. See, e.g., Brinker et al, "Comparisons of Sol-Gel Derived Thin Films with Monoliths in Multicomponent Silicate Glass Systems", Thin Solid Films, 77 (1981) 141-148, which disclosure is entirely incorporated by reference herein. In this publication, it is concluded that, as a function of conversion temperature, most film properties display trends similar to those known for monolithic systems; however, film properties for a given curing temperature consistently reflected higher density, lower surface area and higher refractive index. The differences were not explainable. It was generally found that densification behavior of films was different from that of monoliths. There was no report of how the properties of the film could be controlled by control of the various operating conditions.

In Brinker et al, "Sol-gel Derived Antireflective Coatings", Proceedings of the Distributed Solar Collector Conference, Albuquerque, NM, Mar. 1983, 68–80, it has been disclosed that the properties of thin films deposited using the sol-gel process are affected by the time of aging of the sol-gel solution from which the films are grown. In general, it was expected that increased aging would increase the pore size of the film. However, no details were given of how the system could be controlled to predetermine the desired porosity and other characteristics of the final film, taking into account all of the necessary controlling parameters. The question still remained of how processing conditions could be reliably controlled to predetermine such important characteristics in thin films since the prior art studies in this regard relate only to macrosystems and not the microsystems inherently involved in thin films.

SUMMARY OF THE INVENTION

Accordingly, it is an object of this invention to provide a method of applying thin films of a polymer by sol-gel processing whereby the properties of the thin film deposited on a substrate can be controlled and predetermined by control and selection of the important process parameters.

It is another object of this invention to provide such a method whereby the curing temperature necessary for the deposited thin film can also be controlled.

It is yet another object of this invention to provide such a method which can employ preprepared and preaged solutions which result in reliably predictable thin film properties.

Upon further study of the specification and appended claims, further objects and advantages of this invention will become apparent to those skilled in the art.

These objects have been achieved by providing a method of coating a substrate with a thin film of a polymer of predetermined porosity, which may be defined as the ratio of the volume of air or void contained within a material to the total volume (solid material plus air or void), expressed as a percentage (see "Whittington's Dictionary of Plastics," second edition, page 259, Technomic Publishing Co., Inc., Westport CT, 1978), said method comprising depositing the thin film on the substrate from a non-gelled solution comprising at least one metal alkoxide of a polymeric network forming cation, water, an alcohol compatible with the hydrolysis and the polymerization of the metal alkoxide, and an acid or a base, prior to said depositing step, controlling the porosity and structure of said coating for a given composition of said solution exclusive of the acid or base component and the water component, by adjusting each of the water content, the pH, the temperature and the time of standing of said solution, increasing/decreasing the water content or the pH, to increase/decrease the pore size of said coating, and increasing/decreasing the temperature or time of standing of said solution to increase/decrease the pore size of said coating, increasing/decreasing the water content or the pH to increase/decrease the densification temperature of said coating and curing said deposited film at a temperature effective for curing whereby there is obtained a thin film coating of a polymer of a predetermined porosity on the substrate.

In an especially preferred aspect of the method, the sol-gel solution is prepared with the desired preselected water content, pH, composition and standing time and then cooled to a temperature at which the polymer in the solution undergoes essentially no growth, e.g., 15° C. or, typically 0° C. or lower.

DETAILED DISCUSSION

This invention is based upon the determination of the various relationships among the sol-gel solution characteristics themselves and of these with the properties of the resultant film. Contrary to the implications of the prior art preliminary observations, solution aging manipulations are not sufficient to control the important process parameters and the resultant film properties.

In order to reliably predetermine a desired porosity for a given film, there is required preselection of solution water content, pH and, to a lesser extent, other compositional features, as well as the time and temperature at which the solution is permitted to stand before deposition. In the usual and preferred mode of operation, the aged solution will be "trapped" at the desired growth stage by lowering its temperature to a value at which growth essentially ceases, e.g., typically less than about 15° C., preferably less than 0° C. or lower. In dilute solution it is possible therefore selectively to grow polymers without the interference of gelation using proper control. A wide range of polymer topologies is thus made available. In one solution regime, the system has a low pH, e.g., less than about 3 and a low water content, e.g., less than about 4 moles of water per mole of total alkoxides. Under these conditions, there is a very low rate of polymer growth. The resultant polymers are linear or randomly branched in nature. Appreciable growth upon aging under such low water conditions, generally will require an increase in the pH to values of about 5, more preferably about 8-9. The resultant more highly branched polymers which are produced under such conditions can normally be grown to desired sizes in periods up to about 1 month.

Increasing the system pH and/or the amount of water will increase the growth rate of the polymers and, significantly, alter the shape and size of the polymers. Increasingly, the polymers will become less linear and more cluster-like. In the extreme, i.e., at high water contents, e.g., greater than 10 moles of water per mole of total alkoxides and high pH's, e.g., greater than about 7, colloidal particles of essentially pure silica can be grown in solution at aging times from several days up to 1 or 2 weeks depending upon the precise system involved.

Under intermediate conditions, e.g., for intermediate water contents of about 4 to about 10 moles of water per mole of total alkoxides, appreciable growth upon standing of the solution will be observed for pH's of about 4 and above. For such medium water contents and medium pH's of about 4–7, typical suitable growing periods of 2-3 weeks will provide a wide range of predeterminable end-film porosities. As the amount of water is increased, the minimum pH at which satisfactory growth rates occur, as described above, will decrease. For instance, at the mentioned high water contents of 10 or more moles of water per mole of total alkoxides, satisfactory growth rates are still observed at low pH's of about 2.5.

As can be seen, linear or weakly branched polymers of varying dimensions can be selected by choosing sol-gel systems having low pH's and/or low water contents as described above. Under these essential conditons of water content and pH, solution aging can be used to control the polymer length desired. Where cluster-like growth of the polymers is intended, higher water contents and/or higher pH's are employed. Under these conditions, aging can similarly be used to control the size and extent of cluster formation. As can be seen, without precise consideration of and control of the additional parameters of water content and pH, it is not possible to use solution aging alone as a convenient means of fine tuning the desired polymer size and/or topology.

The temperature at which the solution is permitted to stand also has an effect on the polymer growth. However, this is essentially only a kinetic effect, growth rates increasing with increasing temperature. Typically, solutions are aged at temperatures of 40°-80° C., most typically 50°-60° C. Temperature control is especially useful, and is an important aspect of this invention, in terms of trapping the solution at a certain growth stage as mentioned above. The higher temperatures play an important role in situations where it is desired to form polymers in as high a colloidal state as possible, i.e., when high water contents and high pH's are used to effect rapid growth rates and cluster-like shapes.

After the desired polymer growth has been completed, the solution can immediately be deposited onto the desired substrate. More preferably and more conveniently, the solution, said characteristics being influenced by the polymer structure (i.e., degree of branching and molecular weight or size) will be trapped at a lower temperature in its desired growth stage and subsequently used for deposition of a thin film on the desired substrate.

The porosity and corresponding pore size of the final film vary with the polymer characteristics of the sol-gel solution in the following fashion. In general, the more linear (less branched) a polymer, the smaller the resultant pores will be. The more cluster-like the polymer and the larger the cluster sizes, the larger the pores will be. Consequently, low water contents and low pH's which produce more linear polymers result in films having low porosity; high water contents and high pH's foster the attainment of films having larger pore sizes. In the low water/low pH regimes, the polymer is weakly crosslinked in solution. As a result, the polymer chains are able to collapse over and around one another upon deposition, thereby densely packing before significant crosslinking occurs at which point further solvent removal results in porosity. The dense packing produces the fine pore size. At the other end of the spectrum, the highly branched polymeric clusters cannot pack closely to one another and produce a relatively large pore structure. The linear type polymers are more easily crosslinked in the thin films and relatively less and more rapid heating will be effective to fully densify them, when this is desired. For the cluster embodiments, crosslinking between cluster contact points will be a much more energy-dependent process which depends on diffusion or macroscopic flow.

Typically, the low pore size films will have pores in the range of about 10-20 Angstroms, smaller or larger pores being possible. At the other extreme, the large pore sizes are generally in the range of 100-500 Angstroms, again larger or smaller pores being possible. The applications to which the small pore size films are most applicable are those wherein a dense, pin hole-free, protective-type glass-like film is desired. These include chemically and environmentally resistant protective coatings, dielectric and insulating coatings, planarization and interlayers and semiconductor-type devices, etc. For these purposes, the deposited low porosity films are densified at a temperature which can be tailored to the temperature sensitivity of the underlying substrate. Thus, where temperature sensitive substrates are involved, relatively low curing temperatures of about 350°-400° C. can be employed. Where temperature is not a problem, higher temperatures in the range of about 1000° C. can be used. The lower temperatures, of course, require somewhat longer times for full densification.

The large porosity films are employed for various optical purposes, e.g., to provide a substrate with an antireflection (AR) coating having the requisite low refractive index achieved by the proper pore size or situations in which stable porosity is desired at elevated temperatures such as AR coatings on solar dish receiver apertures and catalytic films on supported substrates. Such films do not normally require curing as do films which must be fully densified. Rather, heating for purposes of drying, e.g., 400°-500° C. for a few hours will suffice. Under these conditions, the polymer clusters undergo interparticle crosslinking to some extent, thereby providing the coating with a higher degree of rigidity. If such films are heated to higher temperatures, e.g., 750°-800° C. or above, they too will fully densify and lose their low refractive index, large pore size and high surface area characteristics.

It has, surprisingly, been discovered that the relationships between thin film properties and sol-gel solution properties carry over to a large extent from the corresponding relationships known for monolithic bulk systems described in the references cited above. However, aging in dilute solution makes a wider range of polymer sizes and shapes attainable. In addition, the process of film formation is quite unlike bulk gel synthesis in that solvent is removed in seconds rather than weeks so that further structural changes do not occur appreciably in films whereas gel structures can change dramatically over the course of days required to remove solvent from bulk gels. In the limited cases where bulk and thin film gel structures are similar, much of this prior art can be used as a guide in the preselection of appropriate conditions under which the desired film porosity can be achieved.

By thin films herein is typically meant films on the order of 100 Angstroms or less up to about 10,000 Angstroms. In such thickness regimes, bulk effects are often not displayed or are significantly changed. This along with different polymer structures attainable in films accounts for the unexpected nature of many of the findings discussed above. In order to effect such thin films, it is required to prepare sol-gel solutions which are significantly more dilute than those conventionally prepared in order to form bulk gels. Typically, the range of equivalent weight percent of alkoxide is 1-10% or even greater, e.g., even up to 12-16% for certain cases. Typically, the range of equivalent weight percent of oxide is less than 5%, often 2-3%. Functionally, it is required that the solution be sufficiently dilute that it would not gel at room temperature for at least one month.

Suitable compositions of aqueous alcoholic solutions containing the polymeric network of partially hydrolyzed metal alkoxide(s) include all those fully described in the prior art, e.g., the cited references. Suitable metal alkoxides include especially those having alkyl portions of 1-4 carbon atoms. Higher numbers of carbon atoms can also be used, e.g., 6 or 7 carbon atoms; however, the higher the carbon atom number, the more difficult will be the drying of the applied film and the slower will be the hydrolysis reaction and the rate of condensation in solution.

Suitable metals in the metal alkoxides include a very wide group of metals, such as those of Groups II, III, and IV of the Periodic Table, as well as the transition metals and other multivalent (e.g., +3, +4, +5, etc.) metals whose alkoxides form three-dimensional polymeric networks upon hydrolysis. Usually, the metal is one like boron, aluminum, titanium, silicon, zirconium, and other ceramic types of metals. Mixtures of metal alkoxides can also be used to tailor the properties of the film to the requirements of the application, as is fully conventional.

Suitable alcohols for use in the solution are lower alkanols, e.g., $C_{1-4}$ alkanols. Often, the alkyl portion of the alcohol will be the same as that of the alkyl portion of the alkoxide. However, the precise identity of the alcohol is not critical. In general, as with the alkoxides, the higher the molecular weight of the alcohol, the slower will be the drying process, and the slower will be the polymerization process for the network. It is also possible to use in place of or in addition to the metal alkoxides, combination derivatives of alkoxides and alcohols, such as methoxyethanols, etc.

Optionally, the solution can further comprise system compatible metal salts such as salts of the alkali metals or alkaline earth metals or transition metals, etc., with system compatible anions such as nitrates, acetates, etc. These salts are added also to tailor the properties of the resultant film to the desired end use. In general, these additions have the same kinds of effects as they do in normal glass compositions. For example, addition of alkali metals to the blend will lower the glass transition temperature of the final oxide film as is well known. Such additions can, e.g., be used to reduce Tg where a highly dense film is desired and which otherwise might have an inordinately high densification or sintering temperature. Thus, these salts can have a flux-like effect. Again, care should be taken that the salt does not adversely influence the coherency of the finally obtained film. For example, the salt should not be one which will crystallize rapidly upon drying of the film. If rapid crystallization occurred, the film would have a tendency to become heterogeneous. In this regard, see any of the many classical texts on glass, e.g., *Glass Science*, R. Doremus, Wiley Interscience Pub., 1973.

For acid hydrolysis, inorganic acids are usually employed, e.g., HCl, $HNO_3$, etc. The precise acid is not critical; however, HF gives effects mirroring base-condition effects due to coordination effects derived from F-atoms. Suitable bases include ammonium hydroxide or other equivalent weak bases. More generally, suitable pH's to be selected by the foregoing criteria are in the range of 1–12, intermediate pH's optionally being achieved by addition of suitable buffer systems such as acetic acid/acetate, etc., larger or smaller pH values being possible.

The precise composition of the solution will again be dependent upon the components involved and the final properties desired. Generally, the following relative proportions will be used: 50–100 weight parts of total metal alkoxide and metal salt, the latter component being provided in an amount of up to 50% of this total; 1,000–10,000 weight parts of alcohol; 10–500 weight parts of water; and sufficient amounts of acid or base to achieve the mentioned pH's, e.g., normally from a few drops up to about 1 ml of 1 N HCl will suffice or up to 3 ml of $NH_4OH$; all being selected to provide the necessary solutions discussed above.

Precise amounts can vary outside of these ranges as necessary. For example, the amount of metal salt employed will depend upon the nature of the final property desired. For low temperature curing situations, larger amounts of an alkali metal salt can be employed, for example. Larger amounts of alcohol can also be provided to increase the dilution of the network structure. Typically, the solution applied to the substrate will have a viscosity in the range of $10^{-1}$ to 15 poises, lower or higher amounts being possible.

The solutions can be applied to the substrate in any conventional fashion such as dipping, spraying or spinning (especially in conjunction with semiconductor substrates).

Illustratively, thickness control can be achieved, e.g., in a dipping operation, by control of any of the following parameters: (1) concentration of the sol-gel solution; (2) viscosity of the sol-gel solution; (3) dipping speed; (4) dipping angle, etc. In a spraying operation, the first two parameters as well as the spraying time can also be used to control thickness.

The amount of solution applied to the substrate in a given operation will be fully conventionally determined, e.g., by conventional consideration of the amount of ingredients in the solution and the desired thickness. The latter, of course, will be determined by the end use involved, the thinnest coating which provides the desired property often being chosen. The solution is normally applied on a room temperature substrate, but, of course, it is also possible to preheat the substrate and then apply the solution thereto, the rate of densification being increased thereby.

The application and/or heating steps (discussed above) can be carried out under normal atmospheric conditions. However, when dictated by conventional considerations, these steps can be carried out in an inert, reducing or oxidative atmosphere, or even in vacuo, if necessary. For example, whether a reducing, oxidative or inert atmosphere is employed will often be determined by substrate-specific considerations. Where a silver substrate is involved, it will often be desirable to employ an inert, e.g., nitrogen or argon, or reducing atmosphere so that, should any of the gas penetrate through the film, the silver substrate will not be oxidized. Generally, the curing atmosphere does not affect the final film properties; it only preserves the desired oxidation state of the substrate surface.

There is essentially no limitation on the compositions of the substrate surface which are suitable. Metals, glasses, ceramics, semiconductors, non-refractives, etc., can all be coated using the method of this invention. As mentioned, the method is particularly applicable to substrates which are low melting and to which it is normally difficult to apply glass-like coatings since the heretofore required heating step damages the low melting substrate. Thus, the invention is particularly applicable to substrates such as aluminum, polymers such as Kapton ®, Pyres ®, low melting alloys, etc. Of course, it is equally applicable to higher melting substrates such as those mentioned above, including metals such as copper, nickel, glasses, ceramics, etc. It is not necessary that the substrate's surface have an available hydroxy group as depicted in the foregoing. Almost all substrates will have at least one monolayer of oxide thereon. This will be sufficient to ensure adequate coherency and adherency of the film. Furthermore, the films of this invention can be adhered to substrates via condensations other than that depicted above, e.g., with amino groups. Hence, this invention has the widest application.

Similarly, there is no limitation on the shape or size of the substrate surface to which the films of this invention can be applied. It is particularly applicable in situations where the substrate has a complex shape in view of the abnormally high adherency which is achieved by this invention due to the excellent wetting properties of the film. Very large substrates are fully suitable also. Moreover, because the liquid solution of this invention can be applied and rapidly gelled to form a stiff layer, spun films planarize surfaces even with complex topologies. This is an important aspect for semiconductor applications. Additional important aspects of this invention from an industrial point of view include its low cost derived from the applicability of simple deposition methods, plus the fact that compositional control can be effected simply by controlling the chemical structure of a liquid solution, inter alia.

Conventional diagnostic techniques are employed to monitor the polymer growth during aging of the sol-gel solutions and also to monitor the thickness and measure the porosity of the applied thin films. These techniques are described thoroughly in the references cited above and include methods such as ellipsometry, gas adsorption/desorption measurements, static light scattering, low angle X-ray scattering, etc.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever. In the following examples, all temperatures are set forth uncorrected in degrees Celsius; unless otherwise indicated, all parts and percentages are by weight.

EXAMPLE 1

Polymerized silica solutions were prepared by the following three methods:

A. Tetraethylorthosilicate TEOS (61 ml), absolute anhydrous ethanol (61 ml), 1N (0.2 ml) and $H_2O$ (4.87 ml) were combined in a reaction flask at 60° C. After stirring for 1.5 hours under reflux, the solution was cooled to 30° C. and 58.4 ml of $H_2O$ was added. This solution was reacted under reflux for 30 minutes and then diluted 5:1 with absolute, anhydrous ethanol.

B. TEOS (61 ml), absolute anhydrous ethanol (61 ml), 1N HCl (0.2 ml) and $H_2O$ (4.87 ml) were combined in a reaction flask at 60° C. After stirring 1.5 hours under reflux, the solution was cooled to 30° C. and 5.0 ml of water and 15.2 ml of 1N HCl were added. This solution was reacted under reflux for 30 minutes and then diluted 5:1 with absolute, anhydrous ethanol.

C. TEOS (61 ml), absolute anhydrous ethanol (61 ml), 1N HCl (0.2 ml) and $H_2O$ (4.87 ml) were combined in a reaction flask at 60° C. After stirring 1.5 hours under reflux, the solution was cooled to 30° C. and 12.7 ml of 0.03 M $NH_4OH$ was added. This solution was reacted under reflux for 30 minutes and then diluted 5:1 with absolute, anhydrous ethanol.

Solutions prepared by each of these three methods were applied to single crystal silicon substrates (on which a thin (<10 nm) thermal $SiO_2$ film had been grown) by a conventional spinning process. Process variables were controlled so that each coating resulted in a film approximately 100 nm thick. Three coatings were applied to each substrate. After the first and second coatings, the films were dried for 5 minutes at 80° C. After the third coating, the substrates were heated for 5 minutes in an annealing oven which had been preheated to the desired temperature (400°-1000° C.). After heating, current versus voltage measurements were performed on 1 $mm^2$ area structures. The results are summarized in Table 1.

TABLE 1

| Preparation | Treatment Temperature °C. | | |
|---|---|---|---|
| | 400 | 600 | 1000 |
| Method A | $2.8 \times 10^{-11}$ | $1.2 \times 10^{-11}$ | $1.8 \times 10^{-13}$ |
| Method B | $1.0 \times 10^{-9}$ | $6 \times 10^{-11}$ | $3 \times 10^{-12}$ |
| Method C | $8.0 \times 10^{-9}$ | $5 \times 10^{-9}$ | $2 \times 10^{-12}$ |

Measured current through 1 $mm^2$ at 20 V (amperes).

The dielectric strengths of these films after the 1000° C. heat treatment were: Method A, 2.7 MV/cm, Method B, 1.7 MV/cm, and Method C, 2.3 MV/cm. Thus, although all three methods produce essentially pure $SiO_2$ films, it is apparent that the dielectric properties are optimized by Method A. This preparation method results in the growth of small discrete clusters whereas Method B results in weakly branched polysiloxane chains and Method C results in larger discreet clusters. Method A results in higher density than Method C and reduced hydroxyl contents compared to Method B thus optimizing dielectric and densification properties.

The breakdown strength of Method A films after heating to 400° C. and 600° C. were 1.6 and 2.5 MV/cm, respectively.

EXAMPLE 2

Solutions prepared according to Method A were spin coated on silicon substrates as in Example 1. After 6 applications, the coated substrates were heated for 5 minutes at 1000° C. Currents less than $1 \times 10^{-12}$ amperes through 1 $mm^2$ area samples were measured for voltages up to 160 V at which voltage the film broke down. The dielectric strength of this film was 4.2 MV/cm.

Example 3

Solutions prepared according to Method A were spin coated on silicon wafers which had complex surface topologies due to Al and polycrystalline silicon patterning. After 6 applications the coated substrates were heated for 5 minutes at 450° C. Scanning electron microscopy showed that these films effectively planarized the surface.

EXAMPLE 4

A definition of critical process parameters was made before optimizing a procedure for large-scale use in preparing AR coatings on large Pyrex receiver envelopes. The initial parameters of interest were solution aging time and temperature, heat treatment, etching conditions, number of coats, coating speed, and drying conditions. A single polymeric sol-gel solution composition was employed which, unfortunately, limited the flexibility of the experiment. This composition was (wt%): 71 $SiO_2$, 18$B_2O_3$, 7$Al_2O_3$, and 4BaO. Preliminary coatings were applied to Pyrex panels (0.60 m long $\times$ 6.0 cm wide), and initial processing decisions were based on spectral reflectance data. These measurements were made using a Beckman Model 5270 spectrophotometer over the wavelength range 300–2400 nm.

The thickness and index of sol-gel derived films are fixed by solution composition, viscosity, and age; coating speed; and number of coats applied. Films were applied to silicon wafers, and thickness and refractive indices were determined using a Gaertner L119X research ellipsometer equipped with a 6328-Å wavelength He/Ne laser.

A method for monitoring solution stability with long-term use was based on viscosity measurements which can detect continued polymer growth with solution aging. A Wells-Brookfield coneplate viscometer, Model RVTD with a CP-40 spindle, was used to monitor viscosity as a function of solution age.

Coatings applied from unaged (freshly prepared) solutions in which dynamic light scattering proved that there was no appreciable polymer growth, exhibited no AR effect after a 550° C. heat treatment regardless of the etching treatment due to the fact that unaged solutions of this composition produce rather dense films with small pores which densify completely by 550° C. Aged solutions produced coatings with progressively higher solar transmittance values as the polymer size increased. Thus, a minimum amount of polymer growth was needed in the system to achieve the low refractive index required for AR film formation. For this composition, the "window" for room-temperature aging extends to at least 6 months.

The aging was accelerated by increasing the solution temperature to 50° C. The optimum AR effect was achieved after two weeks of aging. To allow for continued polymer growth during room temperature coating operations, the minimum aging time at 50° C. was set at 6 days, compared with 60 days at room temperature. To trap polymer growth, the coating solution was stored at 4° C. when not in use.

The heat treatment schedule for 3.0 m-long receiver envelopes was limited by the equipment available. To process tubes continuously rather than in a batch, a belt furnace was used. A belt speed of 5 cm/min resulted in a total time of 12 minutes at 500° C. A comparison of the solar averaged transmittance as a function of etching time for triple-coated samples processed at 500° C. for either 12 minutes or 1000 minutes is shown in Table 2. For comparison, the transmittance of uncoated Pyrex is 0.916. The results indicate that maximum transmittance occurs after 15 minutes of etching regardless of the heat-treatment time. The slightly higher transmittance values for the 1000 minute heat treatment were not considered large enough to justify the great increase in heat-treatment time.

TABLE 2

| | Transmittance vs Heat Treatment | |
|---|---|---|
| | Solar Transmittance | |
| Etch time (min) | 500° C. 1000 min | 500° C. 12 min |
| 0 | 0.942 | 0.932 |
| 5 | 0.953 | 0.958 |
| 15 | 0.970 | 0.964 |
| 20 | 0.963 | 0.964 |
| 30 | 0.959 | coating removed |

After application, heated sol-gel coatings were acid etched to reduce the thickness and refractive index for optimum AR film formation. This was necessary again as a result of the nature of the particular composition used. Other compositions can obviate the need for etching in preparing AR films. A final coating, 1127- to 1230-Å thick, with a refractive index of 1.22, must be produced to satisfy the requirements for a quarter-wavelength interference film with a reflectance minimum at 550–600 nm. An etchant containing $H_2SiF_6/NH_4HF_2$ was used to produce AR films on Pyrex. A concentration of $0.26NH_2SiF_6/0.015\%NH_4HF_2$ resulted in good AR film formation in 3–5 minutes at room temperature.

After initial heat treatment at 500° C., the unetched film exhibits a minimum reflectance of ~0.38 at 800 nm. Etching for 5 minutes decreases both the thickness and refractive index, resulting in a discreet reflectance minimum of only 0.012 at 625 nm. After etching, the film was heated a second time at 500° C. in an attempt to remove residual water. The additional heating resulted in continued densification of the coating as evidenced by the shift in minimum reflectance from 625 nm to 550 nm.

Visual monitoring during etching was an effective quality control measure. As etching progressed, the color of the film when dried gradually changed from light blue to the dark blue-purple characteristic of a good AR film. Overetching resulted in a brown coating and eventually in complete film removal.

Initial sol-gel films of this composition required multiple coats for optimum AR effect. The transmittance of coatings prepared by the application of 1, 2, or 3 coats was measured. The solution was aged for 1 week at 50° C. and coats were applied at a coating speed of 12.7 cm/min and heated at 500° C. before etching. The etching times required (min) and the maximum solar-averaged transmittance were about 0.938(5), 0.960(12) and 0.968(25). The application of 2 or 3 coats results in excellent AR film formation after etching. A single coat, which would greatly simplify processing, was far below optimum transmittance, although better results would be expected if the thickness of the single coat was increased.

When applying films by dipping, the thickness of the coating is dependent on the viscosity and coating speeds: increased viscosity and coating speed result in thicker films. Table 3 shows the results of ellipsometry measurements made along the length of a 7.6-cm sample for a single coat applied at various speeds. As expected, the thickness of the coatings increased as the coating speed increased. The sample coated at 12.7 cm/min was nonuniform, with a thickness <1180 Å that is required for a quarter-wavelength film at 550–600 nm. The variation in thickness of this sample may be due to drying effects.

The most uniform coating was obtained at a coating speed of 25.4 cm/min (10 in./min). In addition, the thickness of this film was greater than that required for a quarter-wavelength film and would not require excessive etching to achieve optimum thickness. The 38.1 cm/min (15 in./min) results suggest that there is an upper limit to uniform single-coat thickness. The coating becomes progressively thicker along the length of the sample, possibly indicating "sagging" of the film.

TABLE 3

| | Coating Speed vs. Thickness | | |
|---|---|---|---|
| Coating Speed (cm/min) | Thickness (Å) | | |
| | Top | Middle | Bottom |
| 12.7 | 822 ± 3 | 823 ± 2 | 968 ± 1 |
| 25.4 | 1375 ± 2 | 1357 ± 2 | 1382 ± 6 |
| 38.1 | 1880 ± 4 | 1969 ± 2 | 2149 ± 4 |

Based on these results, in addition to the aging studies, a single coat of a one-week-old solution applied at 25.4 cm/min was chosen for large-scale processing. Transmittance values of 0.965 for a test coating applied in this manner indicated that excellent AR properties can be obtained with considerable simplification of the process.

A study of experimental variables indicated a correlation between seasonal variations in ambient relative humidity and coating quality. Samples coated in ~20% RH were clear, whereas samples coated at 60% RH were opaque. To standardize drying conditions, subsequent samples were coated and dried in flowing dry nitrogen ($N_2$), resulting in clear, uniform coatings.

The sol-gel coating solution of the oxide composition (wt%) 71 $SiO_2$, 18 $B_2O_3$, 7 $Al_2O_3$, 4 BaO was used again in this process. A schematic representation of the preparation method is shown below.

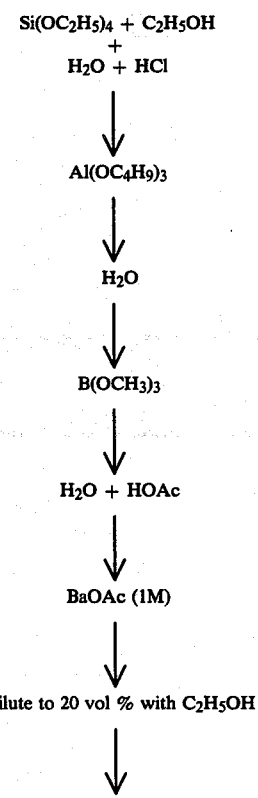

$Si(OC_2H_5)_4 + C_2H_5OH$
$+$
$H_2O + HCl$
↓
$Al(OC_4H_9)_3$
↓
$H_2O$
↓
$B(OCH_3)_3$
↓
$H_2O + HOAc$
↓
BaOAc (1M)
↓
Dilute to 20 vol % with $C_2H_5OH$
↓

-continued

Age at 50° C.

Details of the solution preparation are as follows:
1. In a reaction flask equipped with a stirring mechanism and water-cooled condenser there were mixed:
   1220 ml ethanol (absolute)
   1220 ml tetraethoxysilane (TEOS)
   4 ml 1M HCl
   48 ml deionized water and the solution stirred for 1.5 h at 60° C. and then cooled to 40° C.
2. 174 g of aluminum-sec-butoxide was dissolved in 180 ml of isopropyl alcohol and added to the TEOS/alcohol mixture. After stirring for 10 min at 40° C., 44 ml of deionized water was added. The solution was stirred for 10 min at 40° C.
3. 269 ml of trimethylborate was added; stirring 1 h at 40° C.; then cooling to 25° C.
4. At 25° C., there were added in sequence:
   258 ml H$_2$O
   80 ml concentrated glacial acetic acid
   258 ml H$_2$O
   108 ml 1M barium acetate
   Stirring 15 min at 25° C.
5. 1 part sol-gel was diluted with 4 parts absolute ethanol. Care was taken to avoid exposure of the undiluted solution to air. The final volume of diluted solution was ~20$^1$ and contained ~2.9 wt% oxides.
6. Diluted solution was aged at 50° C. for a minimum of 6 days to grow polymer to correct size and crosslinking required for AR coating.

After aging, the solution was stored in a freezer approved for flammable materials to minimize overaging, i.e., to trap polymer growth.

The Pyrex tubes were received in 3.7-m (12-ft) lengths and were cut to 3.0 m (10 ft) with a diamond saw. Since the tubes are coated vertically, a 6.48- to 6.73-cm flare was fabricated into one end to fit into the top guide and holding fixture. The flared tubes were washed in a cleaning solution consisting of 7.1 g Alconox® and 6.4 g trisodium phosphate per liter and rinsed in filtered tap water. The remaining cleaning steps, as well as pre-etching and AR etching, were performed in an acid tank assembly consisting of five individual 4.2-m-long×15-cm-ID PVC troughs. The tanks were equipped with immersion heaters and pumps to provide temperatures up to 60° C. and to flow rinse water continuously down the tubes. After a deionized water rinse, the tubes were pre-etched for 5 min in 10% NH$_4$HF$_2$ at room temperature. It has been suggested that the pre-etch bath removes a thin surface layer of glass which, as a result of high manufacturing temperatures, may be a slightly different composition than Pyrex. After pre-etching, the tubes were rinsed in deionized water at 60° C. to remove residual fluoride ion (F$^-$) and "squeegeed" inside and out to remove particulates. The 60° C. rinse/squeegee step was repeated a second time and was critical in producing a dry, streak-free surface.

After cleaning, the tubes were coated immediately to avoid surface recontamination. The tube was attached to a winch cable, raised into a tower in the second story of the coating facility, and lowered into the filled coating tank. Coating and drying were performed in a dry N$_2$ atmosphere, supplied at an outlet pressure of 3 psi. A restrictor plate on top of the tank maintained a slight positive pressure of N$_2$ during coating.

The sol was withdrawn from the tank at a rate of 25.4 cm/min, requiring 12 min to coat the tube. After coating, a vent at the bottom of the tube was opened, a stopper was placed in the top of the tank, and the tube was dried for 15 min in flowing N$_2$. After drying, the coated tubes were removed to a drying rack and dried under infrared lamps at ~70° C. for 15 min to remove residual solvent.

Because sample tubes which were coated in low temperature solutions (4°-20° C.) were nonuniform, with poor AR properties, the temperature of the sol was monitored continuously during coating and maintained at 23°-25° C. Solution viscosity was measured each day during coating and ranged from 2-3 cP over ~3 mo. A single batch of solution was used to coat ~30 tubes in this 3-mo. period.

Tubes were heated in a conveyor furnace. Total heat-treatment time for each 3.0-m tube was 2 h.

After heat treatment at 500° C., the sol-gel film is a partially dense, glass layer with continuous porosity which must be etched to maximize its AR properties within the requirement of the particular solution chosen, i.e., tailor its thickness and refractive index.

Forty liters of etchant were prepared as follows: 200 ml H$_2$SiF$_6$, 6 g NH$_4$HF$_2$ in 39.81 deionized water.

Each tube was immersed in the room-temperature etchant for the required time and then rinsed in deionized water. Then tubes were dried vertically in a stream of warmed N$_2$ flowing down the center of the tube. The N$_2$, heated by a gas dryer, promoted evaporation of water from the tubes, leaving a dry surface free of streaks and water spots.

Assessment of the AR properties was made both visually and by measured reflectance. If the etched tube was not blue-purple, with a solar transmittance >0.95, the etching process was repeated for 1-min intervals to optimize the AR effect. Films sequentially etched in this manner required slightly more total etching to achieve the same increase in transmittance than was required for films etched continuously. When satisfactory AR properties were achieved, the tubes were reheated at 500° C., as discussed earlier.

Twelve receiver envelopes were processed for installation in parabolic trough collectors in one of four Modular Industrial Solar Retrofit (MISR) test systems located at Sandia National Laboratories. After processing, the solar averaged transmittance of the tubes ranged from 0.956 to 0.968 and varied from ±0.002 to ±0.006 transmittance units from end to end. Five segments were cut at 2-ft intervals along the length of a representative tube to assess circumferential uniformity. Multiple measurements around each segment indicated a variation of ±0.003 to ±0.010 transmittance units. Visual monitoring of AR surface color suggested that there was very little difference between the inner and outer tube surfaces.

Although adsorption of water from the atmosphere has an adverse effect on the quality of the AR film, the original AR properties of the film can be restored by exposure to projected solar trough operating conditions.

These examples commit to practice the ideas comprising this invention, i.e., thin film microstructure can be tailored by appropriate polymer growth in solution prior to film formation. Additionally, one can manipulate the composition of the film to achieve ultimate control of the film properties. The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What we claim is:

1. A method of coating a substrate with a thin film of a polymer of predetermined porosity, comprising:
   depositing the thin film on the substrate from a dilute non-gelled solution comprising at least one hydrolyzable metal alkoxide of a polyermic network-forming cation, water, an alochol or other solvent compatible with the hydrolysis and the polymerization of the metal alkoxide, and an acid or a base, wherein the concentration of the alkoxide in said solution is about 1 to 12 equivalent weight %, and
   prior to the depositing said film, controlling the structure of said polymer for a given composition of said solution exclusive of the acid or base component and the water component,
   (a) by adjusting each of the water content, the pH, and the temperature to obtain the desired concentration of alkoxide, and then adjusting the time of standing of said solution prior to lowering the temperature of said solution, and
   (b) lowering the temperature of the solution after said time of standing to about 15 degrees C or lower to trap said solution in a state in which, after said depositing step, a coating of the desired porosity will be obtained, and
   curing said deposited film by removing a sufficient quantity of solvent to cause gelation, and heating said film at a temperature compatible with the substrate and effective for crosslinking and densifying said film, whereby there is obtained on the substrate a thin film of a polymer of predetermined porosity and corresponding pore size.

2. A method of claim 1, for forming a film of intermediate and large pores, wherein the amount of water in said solution is greater than about 10 moles per mole of total alkoxides, and said pH is greater than about 2.5.

3. A method of claim 2, wherein said pH is greater than about 7 and said time of standing is up to about one week.

4. A method of claim 3, wherein said pores are about 100 to about 500 Å in diameter.

5. A method of claim 1, wherein the amount of water in said solution is 4 to 10 moles per mole of total alkoxides, and said pH is greater than about 4.

6. A method of claim 5, wherein the pH is 4 to about 7 and said time of standing is about 2 to about 3 weeks.

7. A method of claim 1, for coating a film of small pores wherein the amount of water in said solution is less than about 4 moles per mole of total alkoxides, and said pH is greater than about 5.

8. A method of claim 7, wherein said pH is about 8 to about 9.

9. A method of claim 7, wherein said time of standing is up to about one month.

10. A method of claim 1, for coating a film of small pores wherein the amount of water in said solution is less than about 4 moles per mole of total alkoxides, said pH is less than about 4 and said time of standing is up to about one month.

11. A method of claim 1, wherein the temperature of the solution during said time of standing is about 40°–80° C.

12. A method of claim 1 wherein the temperature of the solution during said time of standing is about 40°–80° C.

13. A method of claim 12, wherein the solution is maintained at said lowered temperature for storage purposes.

14. A method of claim 1, wherein said film is of a thickness of about 100–10,000 Å.

15. A method of claim 1, wherein the metal in the alkoxide is silicon and the alcohol is a $C_{2-3}$-alkanol and the acid is HCl or the base is $NH_4OH$.

* * * * *